(12) United States Patent
Palladino et al.

(10) Patent No.: US 10,949,497 B2
(45) Date of Patent: Mar. 16, 2021

(54) HIGH-SPEED MULTI-INPUT TRACKER BASED ON IN-MEMORY OPERATIONS OF TIME-DEPENDENT DATA

(71) Applicant: Crocus Energy, San Jose, CA (US)

(72) Inventors: Frank Palladino, Dudley, MA (US); Benjamin Ott, Tiverton, RI (US)

(73) Assignee: Crocus Energy, San Jose, CA (US)

( * ) Notice: Subject to any disclaimer, the term of this patent is extended or adjusted under 35 U.S.C. 154(b) by 89 days.

(21) Appl. No.: 16/258,349

(22) Filed: Jan. 25, 2019

(65) Prior Publication Data

US 2019/0236112 A1    Aug. 1, 2019

Related U.S. Application Data

(60) Provisional application No. 62/622,674, filed on Jan. 26, 2018.

(51) Int. Cl.
| | | |
|---|---|---|
| G06F 16/23 | (2019.01) | |
| G06F 17/16 | (2006.01) | |
| G06F 17/18 | (2006.01) | |
| G11C 11/4076 | (2006.01) | |
| G06F 16/22 | (2019.01) | |
| G01W 1/04 | (2006.01) | |

(52) U.S. Cl.
CPC .......... *G06F 17/16* (2013.01); *G06F 16/2282* (2019.01); *G06F 16/23* (2019.01); *G06F 17/18* (2013.01); *G11C 11/4076* (2013.01); *G01W 1/04* (2013.01)

(58) Field of Classification Search
CPC ...................................................... G06F 17/16
See application file for complete search history.

(56) References Cited

U.S. PATENT DOCUMENTS

| | | | | |
|---|---|---|---|---|
| 4,942,538 A * | 7/1990 | Yuan | ...................... | B25J 9/1689 |
| | | | | 348/95 |
| 2007/0230773 A1* | 10/2007 | Nagao | .................. | G06K 9/6269 |
| | | | | 382/159 |
| 2015/0234880 A1* | 8/2015 | Huber | ...................... | G06N 5/04 |
| | | | | 707/609 |
| 2019/0370646 A1* | 12/2019 | Rana | ........................ | G06N 3/08 |

\* cited by examiner

*Primary Examiner* — Chuong D Ngo
(74) *Attorney, Agent, or Firm* — Morgan, Lewis & Bockius LLP

(57) ABSTRACT

An electronic device includes one or more processors and memory storing a first logical table for a first time. The first logical table includes a plurality of logical columns, each logical column including an input vector of a plurality of input parameters corresponding to a respective time, and a plurality of logical rows intersecting with the plurality of logical columns, each logical row corresponding to a respective input parameter. The device updates a respective logical column with a first input vector that corresponds to a second time subsequent to the first time, thereby obtaining a second logical table; obtains a first transposed kernel matrix between the second logical table for the second time and the first input vector; determines a first predicted output value for the second time; and outputs the first predicted output value.

18 Claims, 21 Drawing Sheets

$$K(A,B) = \begin{bmatrix} \exp\left(\dfrac{\sum_{k=1}^{n}a^2_{1,k} + \sum_{k=1}^{n}b^2_{1,k} - 2\sum_{k=1}^{n}a_{1,k}b_{1,k}}{-2D^2}\right) & \cdots & \exp\left(\dfrac{\sum_{k=1}^{n}a^2_{1,k} + \sum_{k=1}^{n}b^2_{U,k} - 2\sum_{k=1}^{n}a_{1,k}b_{U,k}}{-2D^2}\right) \\ \vdots & \ddots & \vdots \\ \exp\left(\dfrac{\sum_{k=1}^{n}a^2_{m,k} + \sum_{k=1}^{n}b^2_{1,k} - 2\sum_{k=1}^{n}a_{m,k}b_{1,k}}{-2D^2}\right) & \cdots & \exp\left(\dfrac{\sum_{k=1}^{n}a^2_{m,k} + \sum_{k=1}^{n}b^2_{U,k} - 2\sum_{k=1}^{n}a_{m,k}b_{U,k}}{-2D^2}\right) \end{bmatrix}$$

Figure 5A $$KT(A,C) = \begin{bmatrix} \exp\left(\dfrac{\sum_{k=1}^{n}a^2_{1,k} + \sum_{k=1}^{n}c^2_{k,1} - 2\sum_{k=1}^{n}a_{1,k}c_{k,1}}{-2D^2}\right) & \cdots & \exp\left(\dfrac{\sum_{k=1}^{n}a^2_{1,k} + \sum_{k=1}^{n}c^2_{k,V} - 2\sum_{k=1}^{n}a_{1,k}c_{k,V}}{-2D^2}\right) \\ \vdots & \ddots & \vdots \\ \exp\left(\dfrac{\sum_{k=1}^{n}a^2_{m,k} + \sum_{k=1}^{n}c^2_{k,1} - 2\sum_{k=1}^{n}a_{m,k}c_{k,1}}{-2D^2}\right) & \cdots & \exp\left(\dfrac{\sum_{k=1}^{n}a^2_{m,k} + \sum_{k=1}^{n}c^2_{k,V} - 2\sum_{k=1}^{n}a_{m,k}c_{k,V}}{-2D^2}\right) \end{bmatrix}$$

Figure 5B $$TKTN(C,B) = \begin{bmatrix} \exp\left(\dfrac{\sum_{k=1}^{n}c^2_{k,1} + \sum_{k=1}^{n}b^2_{1,k} - 2\sum_{k=1}^{n}c_{k,1}b_{1,k}}{-2D^2}\right) & \cdots & \exp\left(\dfrac{\sum_{k=1}^{n}c^2_{k,V} + \sum_{k=1}^{n}b^2_{1,k} - 2\sum_{k=1}^{n}c_{k,V}b_{1,k}}{-2D^2}\right) \\ \vdots & \ddots & \vdots \\ \exp\left(\dfrac{\sum_{k=1}^{n}c^2_{k,1} + \sum_{k=1}^{n}b^2_{U,k} - 2\sum_{k=1}^{n}c_{k,1}b_{U,k}}{-2D^2}\right) & \cdots & \exp\left(\dfrac{\sum_{k=1}^{n}c^2_{k,V} + \sum_{k=1}^{n}b^2_{U,k} - 2\sum_{k=1}^{n}c_{k,V}b_{U,k}}{-2D^2}\right) \end{bmatrix}$$

Figure 5C $$K(A,B) = \begin{bmatrix} \sqrt{\dfrac{1}{D^2 + \sum_{k=1}^{n} a_{1,k}^2 + \sum_{k=1}^{n} b_{1,k}^2 - 2\sum_{k=1}^{n} a_{1,k} b_{1,k}}} & \cdots & \sqrt{\dfrac{1}{D^2 + \sum_{k=1}^{n} a_{1,k}^2 + \sum_{k=1}^{n} b_{U,k}^2 - 2\sum_{k=1}^{n} a_{1,k} b_{U,k}}} \\ \vdots & \ddots & \vdots \\ \sqrt{\dfrac{1}{D^2 + \sum_{k=1}^{n} a_{m,k}^2 + \sum_{k=1}^{n} b_{1,k}^2 - 2\sum_{k=1}^{n} a_{m,k} b_{1,k}}} & \cdots & \sqrt{\dfrac{1}{D^2 + \sum_{k=1}^{n} a_{m,k}^2 + \sum_{k=1}^{n} b_{U,k}^2 - 2\sum_{k=1}^{n} a_{m,k} b_{U,k}}} \end{bmatrix}$$

Figure 6A $$KT(A,C) = \begin{bmatrix} \sqrt{\dfrac{1}{D^2 + \sum_{k=1}^{n} a_{1,k}^2 + \sum_{k=1}^{n} c_{k,1}^2 - 2\sum_{k=1}^{n} a_{1,k} c_{k,1}}} & \cdots & \sqrt{\dfrac{1}{D^2 + \sum_{k=1}^{n} a_{1,k}^2 + \sum_{k=1}^{n} c_{k,V}^2 - 2\sum_{k=1}^{n} a_{1,k} c_{k,V}}} \\ \vdots & \ddots & \vdots \\ \sqrt{\dfrac{1}{D^2 + \sum_{k=1}^{n} a_{m,k}^2 + \sum_{k=1}^{n} c_{k,1}^2 - 2\sum_{k=1}^{n} a_{m,k} c_{k,1}}} & \cdots & \sqrt{\dfrac{1}{D^2 + \sum_{k=1}^{n} a_{m,k}^2 + \sum_{k=1}^{n} c_{k,V}^2 - 2\sum_{k=1}^{n} a_{m,k} c_{k,V}}} \end{bmatrix}$$

Figure 6B $$TKTN(C,B) = \begin{bmatrix} \sqrt{\dfrac{1}{D^2 + \sum_{k=1}^{n} c_{k,1}^2 + \sum_{k=1}^{n} b_{1,k}^2 - 2\sum_{k=1}^{n} c_{k,1} b_{1,k}}} & \cdots & \sqrt{\dfrac{1}{D^2 + \sum_{k=1}^{n} c_{k,1}^2 + \sum_{k=1}^{n} b_{U,k}^2 - 2\sum_{k=1}^{n} c_{k,1} b_{U,k}}} \\ \vdots & \ddots & \vdots \\ \sqrt{\dfrac{1}{D^2 + \sum_{k=1}^{n} c_{k,V}^2 + \sum_{k=1}^{n} b_{1,k}^2 - 2\sum_{k=1}^{n} c_{k,V} b_{1,k}}} & \cdots & \sqrt{\dfrac{1}{D^2 + \sum_{k=1}^{n} c_{k,V}^2 + \sum_{k=1}^{n} b_{U,k}^2 - 2\sum_{k=1}^{n} c_{k,V} b_{U,k}}} \end{bmatrix}$$

Figure 6C $$\mu_1 = \begin{bmatrix} \dfrac{y_1 k(x_1, x_1)}{\sigma_n^2 + k(x_1, x_1)} \\ 0 \\ \vdots \\ 0 \\ 0 \end{bmatrix}$$

$$\Sigma_1 = \begin{bmatrix} k(x_1, x_1) - \dfrac{k^2(x_1, x_1)}{k(x_1, x_1) + \sigma_n^2} & 0 & 0 & 0 \\ 0 & 0 & \cdots & 0 \\ 0 & \vdots & \ddots & \vdots \\ 0 & 0 & \cdots & 0 \end{bmatrix}$$

$$Q_1 = \begin{bmatrix} \dfrac{1}{k(x_1, x_1)} & 0 & 0 & 0 \\ 0 & 0 & \cdots & 0 \\ 0 & \vdots & \ddots & \vdots \\ 0 & 0 & \cdots & 0 \end{bmatrix}$$

Figure 7A $$\mu_{t+1} = P_i(\mu_t) + \begin{bmatrix} 0 & \cdots & 0 & \hat{y}_{t+1} & 0 & \cdots & 0 \end{bmatrix}\xrightarrow{Position\_i} + \frac{y_{t+1} - \hat{y}_{t+1}}{\hat{e}_{y,t+1}^2} P_i(h_{t+1}) + \begin{bmatrix} 0 & \cdots & 0 & \hat{e}_{f,t+1}^2 & 0 & \cdots & 0 \end{bmatrix}\xrightarrow{Position\_i}$$

$$Q_{t+1} = P_i(R_i(Q_t)) + \frac{1}{\gamma_{t+1}^2} P_i(q_{t+1}) + \begin{bmatrix} 0 & \cdots & 0 & -1 & 0 & \cdots & 0 \end{bmatrix}\xrightarrow{Position\_i} \overbrace{P_i(q_{t+1}) + \begin{bmatrix} 0 & \cdots & 0 & -1 & 0 & \cdots & 0 \end{bmatrix}\xrightarrow{Position\_i}}^{T}$$

Figure 7B $$\Sigma_{t+1} = P_i(R_i(\Sigma_t)) + S_i$$

802 Update logical cells in a respective logical column, of a first logical table for a first time stored in a first memory, with a first input vector that corresponds to a second time that is distinct from, and subsequent to, respective times corresponding to a plurality of logical columns in the first logical table stored in the first memory, thereby obtaining a second logical table that corresponds to the second time > 804 Select the respective logical column, of the first logical table for the first time, for at least partial replacement with the first input vector that corresponds to the second time > 806 Determine, for each logical column of two or more logical columns of the first logical table, an error associated with removal of the logical column and selecting a logical column, for at least partial replacement, based on errors associated with the two or more logical columns of the first logical table

808 Obtain a first transposed kernel matrix for the second time between the second logical table for the second time and the first input vector that corresponds to the second time > 810 Obtaining the first transposed kernel matrix for the second time between the second logical table for the second time and the first input vector that corresponds to the second time includes: transposing the second logical table for the second time to obtain a transposed updated logical table for the second time; obtaining a kernel matrix for the second time between the transposed updated logical table for the second time and the first input vector that corresponds to the second time; and transposing the kernel matrix for the second time to obtain the first transposed kernel matrix > 812 Obtaining the first transposed kernel matrix for the second time between the second logical table for the second time and the first input vector that corresponds to the second time includes processing the second logical table for the second time and the first input vector that corresponds to the second time with a first transposed kernel operator (A)

Figure 8A

HIGH-SPEED MULTI-INPUT TRACKER BASED ON IN-MEMORY OPERATIONS OF TIME-DEPENDENT DATA

RELATED APPLICATION

This application claims the benefit of, and priority to, U.S. Provisional Patent Application Ser. No. 62/622,674, filed Jan. 26, 2018, which is incorporated by reference herein in its entirety.

TECHNICAL FIELD

This application relates generally to electronic tracker devices, and in particular, circuits, devices, and methods for tracking time-dependent signals.

BACKGROUND

With the advancements in electrical systems, electrical controllers have become almost ubiquitous. For example, many devices, such as home appliances (e.g., heaters, dryers, dish washers, microwaves, etc.) and industrial tools, utilize electrical controllers to provide various electrical controllers for operations.

In some cases, such as in navigation and control of aircraft and spacecraft, electrical controllers need to receive signals (e.g., translational and angular position, velocity, acceleration, etc.) at high speed. In some cases, electrical controllers need an estimation of a subsequent signal. Trackers that are configured to receive a series of signals over time can determine a subsequent signal based on a series of electrical signals measured over time.

With the increased amount of data (e.g., big data) and the complex relationship among data sets, it has become necessary to have trackers that can handle multiple inputs (and multiple outputs). However, the speed of conventional trackers has limited applications of such trackers.

SUMMARY

Accordingly, there is a need for high-speed trackers that can handle multiple inputs and multiple outputs. The above deficiencies and other problems associated with conventional devices and corresponding methods are reduced or eliminated by the disclosed devices and methods.

As described in more detail below, some embodiments include an electronic device with one or more processors and first memory storing a first logical table that corresponds to a first time. The first logical table for the first time includes a plurality of logical columns, each logical column of the plurality of logical columns including an input vector of a plurality of input parameters corresponding to a respective time; and a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters. The device also includes second memory storing one or more programs executable by the one or more processors. The one or more programs including instructions for updating logical cells in a respective logical column, of the first logical table for the first time stored in the first memory, with a first input vector that corresponds to a second time that is distinct from, and subsequent to, respective times corresponding to the plurality of logical columns in the first logical table stored in the first memory, thereby obtaining a second logical table that corresponds to the second time; obtaining a first transposed kernel matrix for the second time between (i) the second logical table for the second time and (ii) the first input vector that corresponds to the second time; determining a first predicted output value for the second time based on a product of: (i) the first transposed kernel matrix for the second time, (ii) an inverse of a transposed kernel matrix for the first time, and (iii) a first mean vector for input vectors in the first logical table; and outputting the first predicted output value for the second time.

In accordance with some embodiments, a computer readable storage medium stores one or more programs for execution by one or more processors of an electronic device. The one or more programs, which, when executed by the one or more processors of the electronic device, cause the electronic device to, for a first logical table for the first time including: (i) a plurality of logical columns, each logical column of the plurality of logical columns including an input vector of a plurality of input parameters corresponding to a respective time and (ii) a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters, update logical cells in a respective logical column, of the first logical table for the first time stored in the first memory, with a first input vector that corresponds to a second time that is distinct from, and subsequent to, respective times corresponding to a plurality of logical columns in the first logical table stored in the first memory, thereby obtaining a second logical table that corresponds to the second time. The one or more programs, which, when executed by the one or more processors of the electronic device, also cause the electronic device to obtain a first transposed kernel matrix for the second time between (i) the second logical table for the second time and (ii) the first input vector that corresponds to the second time; determine a first predicted output value for the second time based on a product of: (i) the first transposed kernel matrix for the second time, (ii) an inverse of a transposed kernel matrix for the first time, and (iii) a first mean vector for input vectors in the first logical table; and output the first predicted output value for the second time.

In accordance with some embodiments, a method for processing time-dependent data is performed at an electronic device that includes one or more processors and first memory storing a first logical table that corresponds to a first time. The first logical table for the first time includes a plurality of logical columns, each logical column of the plurality of logical columns including an input vector of a plurality of input parameters corresponding to a respective time; and a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters. The method includes updating logical cells in a respective logical column, of the first logical table for the first time stored in the first memory, with a first input vector that corresponds to a second time that is distinct from, and subsequent to, respective times corresponding to the plurality of logical columns in the first logical table stored in the first memory, thereby obtaining a second logical table that corresponds to the second time; obtaining a first transposed kernel matrix for the second time between (i) the second logical table for the second time and (ii) the first input vector that corresponds to the second time; determining a first predicted output value for the second time based on a product of: (i) the first transposed kernel matrix for the second time, (ii) an inverse of a transposed kernel matrix for the first time, and (iii) a first mean vector for input vectors in the first logical table; and outputting the first predicted output value for the second time.

In accordance with some embodiments, an electrical system includes an electronic tracker device, one or more processors, and memory storing one or more programs for execution by the one or more processors. The one or more programs includes instructions for: receiving historical energy data for a plurality of groups of electrical devices; obtaining a plurality of target electrical power parameters by processing at least a subset of the historical energy data with the electronic device; and providing the plurality of target electrical power parameters to a power controller communicatively coupled with the electrical system for setting electrical power parameters of one or more groups of electrical devices of the plurality of groups of electrical devices based on the plurality of target electrical power parameters.

In accordance with some embodiments, a method includes receiving historical energy data for a plurality of groups of electrical devices; obtaining a plurality of target electrical power parameters by processing at least a subset of the historical energy data with an electronic tracker device; and providing the plurality of target electrical power parameters to a power controller for setting electrical power parameters of one or more groups of electrical devices of the plurality of groups of electrical devices based on the plurality of target electrical power parameters.

In accordance with some embodiments, a computer readable storage medium stores one or more programs for execution by one or more processors of an electrical system with an electronic tracker device. The one or more programs, which, when executed by the one or more processors, cause the electrical system to receive historical energy data for a plurality of groups of electrical devices; obtain a plurality of target electrical power parameters by processing at least a subset of the historical energy data with the electronic device; and provide the plurality of target electrical power parameters to a power controller communicatively coupled with the electrical system for setting electrical power parameters of one or more groups of electrical devices of the plurality of groups of electrical devices based on the plurality of target electrical power parameters.

Thus, electronic trackers are provided with faster, more efficient methods for tracking electrical signals, thereby increasing the speed, efficiency, and effectiveness of such devices. Such devices and corresponding methods may complement or replace conventional devices and methods for tracking time-dependent data.

BRIEF DESCRIPTION OF THE DRAWINGS

For a better understanding of the various described embodiments, reference should be made to the Description of Embodiments below, in conjunction with the following drawings in which like reference numerals refer to corresponding parts throughout the figures.

FIGS. 5A-5C show examples of kernel matrices computed using the Gaussian kernel function in accordance with some embodiments.

FIGS. 6A-6C show examples of kernel matrices computed using the inverse multiquadric kernel function in accordance with some embodiments.

FIGS. 7A-7C show example numerical operations used for tracking in accordance with some embodiments.

FIGS. 8A-8B are flow diagram illustrating a method of tracking signals in accordance with some embodiments.

DESCRIPTION OF EMBODIMENTS

Reference will be made to embodiments, examples of which are illustrated in the accompanying drawings. In the following description, numerous specific details are set forth in order to provide a thorough understanding of the various described embodiments. However, it will be apparent to one of ordinary skill in the art that the various described embodiments may be practiced without these particular details. In other instances, methods, procedures, components, circuits, and networks that are well-known to those of ordinary skill in the art are not described in detail so as not to unnecessarily obscure aspects of the embodiments.

It will also be understood that, although the terms first, second, etc. may be used herein to describe various elements, these elements should not be limited by these terms. These terms are only used to distinguish one element from another. For example, a first matrix could be termed a second matrix, and, similarly, a second matrix could be termed a first matrix, without departing from the scope of the various described embodiments. The first matrix and the second matrix are both matrices, but they are not the same matrix.

The terminology used in the description of the embodiments herein is for the purpose of describing particular embodiments only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting (the stated condition or event)" or "in response to detecting (the stated condition or event)," depending on the context.

Figure 1:
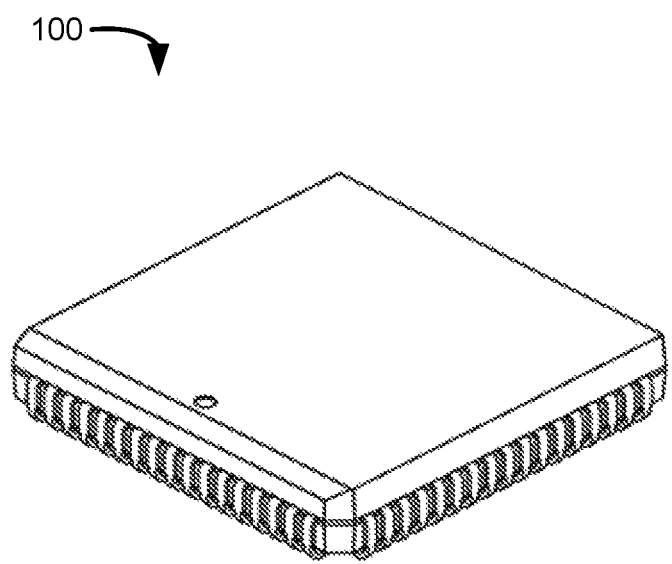
FIG. 1 illustrates an example electronic device in accordance with some embodiments.

FIG. 1 illustrates example electronic device 100 in accordance with some embodiments. Electronic device 100 includes an integrated circuit. Typically, the integrated circuit include semiconductor devices (e.g., transistors, etc.) and is at least partly made by microfabrication techniques. In some embodiments, electronic device 100 is enclosed in an integrated circuit packaging. Electronic device 100 shown in FIG. 1 includes a plurality of leads for receiving and outputting electrical signals.

Figure 2A:
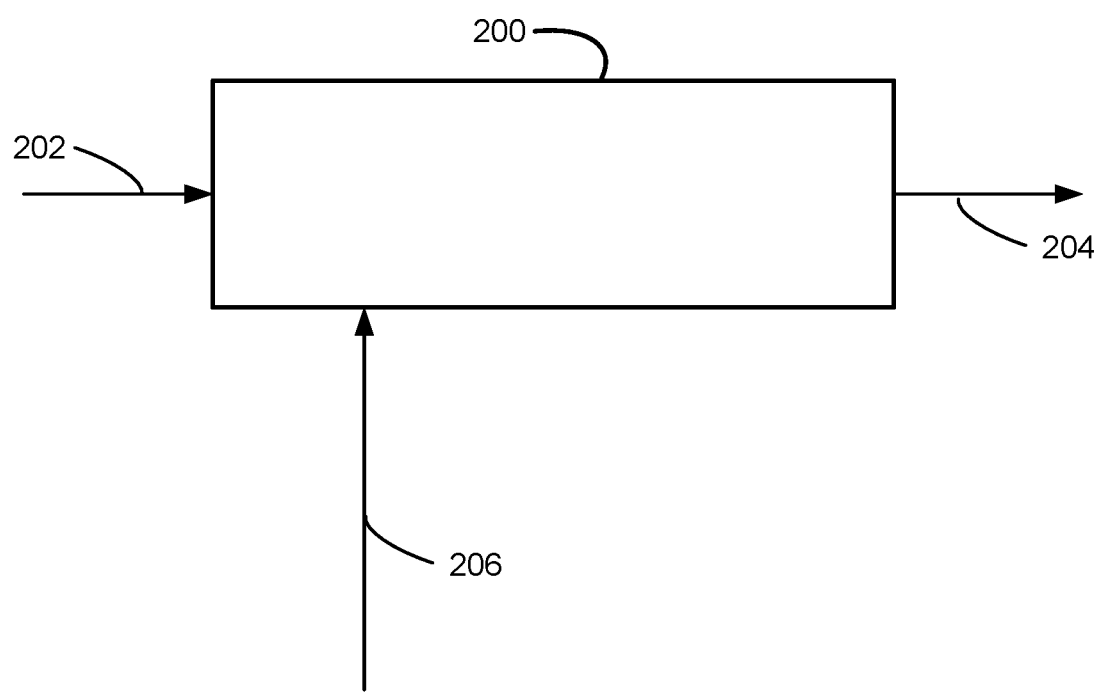
FIG. 2A is a block diagram illustrating an example electronic tracker in accordance with some embodiments.

FIG. 2A is a block diagram illustrating example electronic tracker 200 in accordance with some embodiments.

Electronic tracker 200 is configured to receive input signals 202 and determine (e.g., estimate or predict) a subsequent signal based on received input signals 202. In some cases, electronic tracker 200 receives time-series signals (e.g., signals corresponding to various points in time) and determines subsequent signal 204. Electronic tracker 200 outputs determined signal 204. In some cases, the outputted signal level is received by an electronic controller (e.g., an electronic controller for a navigation system) for determining (or adjusting) one or more control signals.

In some embodiments, electronic tracker 200 is configured to receive correction signals 206. In some cases, correction signals 206 correspond to measured signals (e.g., position, velocity, acceleration, etc.). In such embodiments, electronic tracker 200 determines a difference between determined signal 204 and the measured signal, and utilizes the difference in determining another subsequent signal, thereby improving the accuracy of determination (e.g., prediction).

Figure 2B:
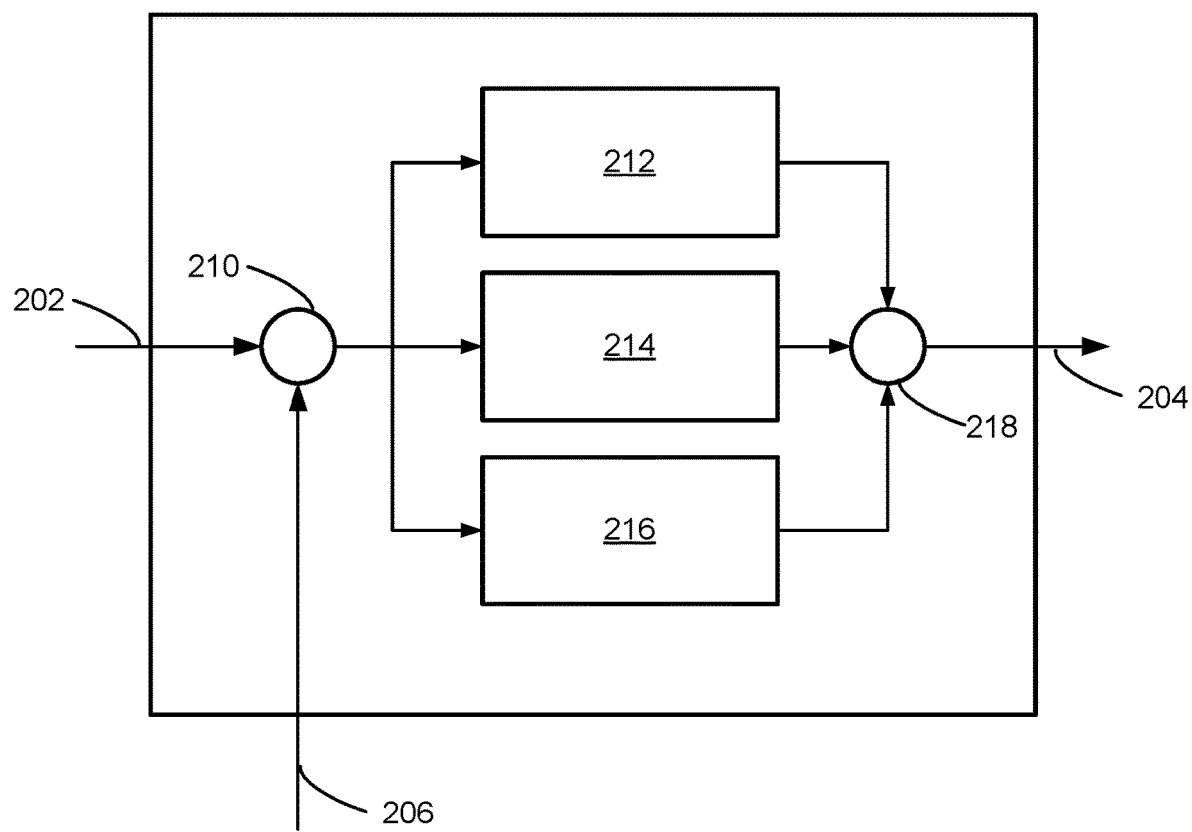
FIG. 2B is a block diagram illustrating an example electronic tracker in accordance with some embodiments.

FIG. 2B is a block diagram illustrating an example electronic tracker in accordance with some embodiments.

The electronic tracker shown in FIG. 2B includes combiner 210 (e.g., analog or digital circuit, such as an adder or a subtractor) configured to determine (or calculate, or generate a signal corresponding to) a difference between received input signals 202 and correction signals 206.

In FIG. 2B, an electrical signal corresponding to the difference between received input signals 202 and correction signals 206 is received by one or more signal processing modules (e.g., signal processing circuits). For example, signal processing module 212 generates an electrical signal that is proportional to the received electrical signal (e.g., the electrical signal corresponding to the difference between received input signals 202 and correction signals 206). Signal processing module 214 generates an electrical signal that is based on integration of the received electrical signal. Signal processing module 216 generates an electrical signal that corresponds to a derivative of the received electrical signal. The signals from the one or more processing modules are combined by combiner 218 (e.g., analog or digital circuit, such as an adder or an electronic mixer). The combined signal is outputted as determined 204.

Although FIG. 2B illustrates three signal processing modules, the electronic tracker may include fewer or more signal processing modules. In some cases, multiple signal processing modules are implemented using a single signal processor or more.

Figure 2C:
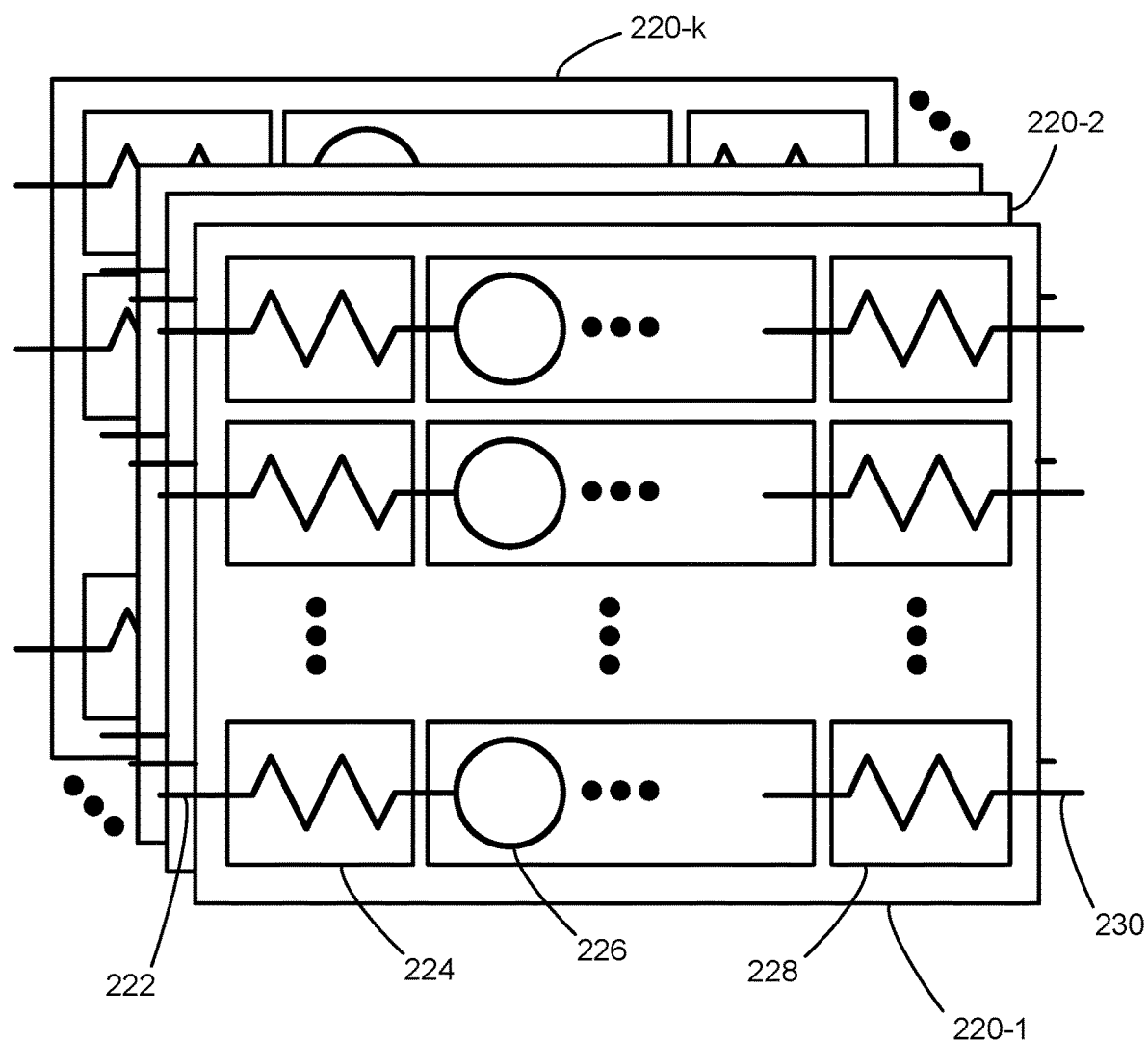
FIG. 2C is a schematic diagram illustrating an example electronic tracker in accordance with some embodiments.

FIG. 2C is a schematic diagram illustrating an example electronic tracker in accordance with some embodiments.

The electronic tracker includes multiple input wires 222 for receiving electrical signals. In some embodiments, multiple input wires 222 (and associated electrical components) are configured to concurrently receive electrical signals.

In FIG. 2C, each input wire 222 is electrically coupled with input impedance 224 (e.g., a resistor), which is, in turn, coupled with one or more electrical circuits. In some embodiments, the one or more electrical circuits include one or more switches 226 (e.g., a transistor) as shown in FIG. 2C.

FIG. 2C also illustrates that each output wire 230 is coupled with an output impedance 228 (e.g., a resistor), which is coupled with the one or more electrical circuits.

In some embodiments, the electronic tracker includes set 220-1 of multiple trackers (e.g., each tracker configured to track a respective signal channel). In some embodiments, the electronic tracker includes multiple sets of trackers (e.g., each set includes multiple trackers for tracking multiple signal channels), such as sets 220-1, 220-2, through 220-$k$.

Figure 3:
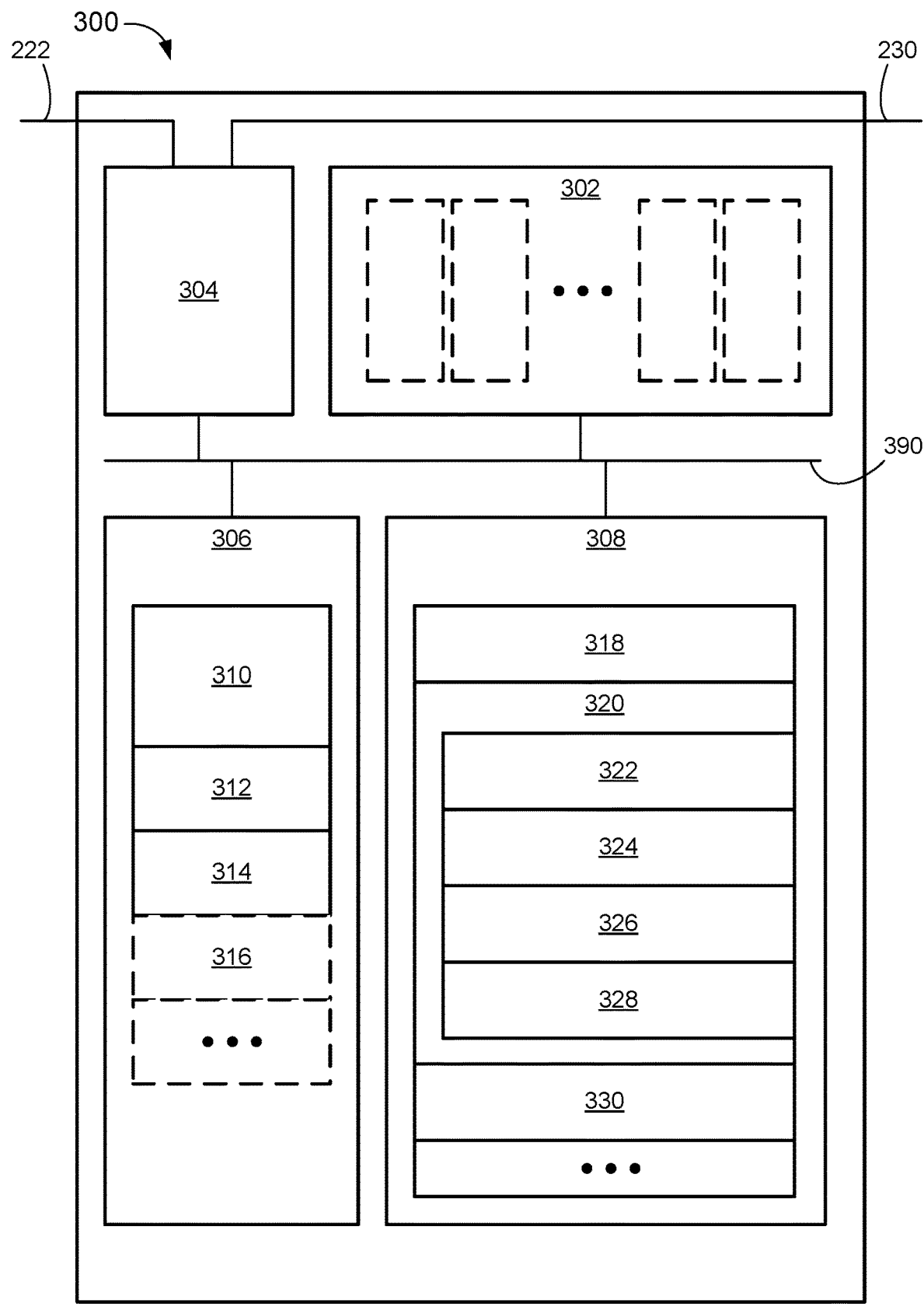
FIG. 3 is a block diagram illustrating an example electronic tracker in accordance with some embodiments.

FIG. 3 is a block diagram illustrating example electronic tracker 300 in accordance with some embodiments. Tracker 300 typically includes one or more processing units 302 (central processing units, application processing units, application-specific integrated circuit, etc., which are also called herein processors), one or more interface circuits 304 (e.g., an analog-digital converter, a readout circuit, and/or a signal generator), first memory 306, second memory 308, and one or more communication buses 390 for interconnecting these components. In some embodiments, communication buses 390 include circuitry (sometimes called a chipset) that interconnects and controls communications between system components.

In some embodiments, one or more interface circuits 304 are coupled with input wire 222 and output wire 230.

First memory 306 of tracker 300 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 306 may optionally include one or more storage devices remotely located from the processors 302. Memory 306, or alternately the non-volatile memory device(s) within memory 306, comprises a computer readable storage medium (which includes a non-transitory computer readable storage medium and/or a transitory computer readable storage medium). In some embodiments, memory 306 includes a removable storage device (e.g., Secure Digital memory card, Universal Serial Bus memory device, etc.). In some embodiments, memory 306 or the computer readable storage medium of memory 306 stores the following data structures, or a subset or superset thereof:
  logical table 310 (which is described in further detail with respect to FIG. 4A);
  transposed kernel matrix 312;
  output value 314; and
  optionally, mean vector 316.

Second memory 308 of tracker 300 includes read-only memory (ROM) or high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 308 may optionally include one or more storage devices remotely located from the processors 302. Memory 308, or alternately the non-volatile memory device(s) within memory 308, comprises a computer readable storage medium (which includes a non-transitory computer readable storage medium and/or a transitory computer readable storage medium). In some embodiments, memory 308 includes a removable storage device (e.g., Secure Digital memory card, Universal Serial Bus memory device, etc.). In some embodiments, memory 308 or the computer readable storage medium of memory 308 stores the following programs, modules and data structures, or a subset or superset thereof:

- data access module 318 configured to access (or read) data stored in first memory 306 and/or store (or write) data to first memory 306;
- tracker module 320 configured to determine a predicted signal; and
- output module 330 configured to output the determined signal, in conjunction with one or more interface circuits 304 (via output wire 230).

In some embodiments, tracker module 320 includes one or more of:

- logical table update module 322 for updating a logical table (e.g., replacing a particular column of the logical table, in conjunction with data access module 318);
- transposed kernel matrix module 324 for obtaining (or calculating or generating) a transposed kernel matrix;
- predicted output module 326 for determining (or calculating or estimating or predicting) a predicted output value; and
- column selection module 328 for selecting one or more columns within a logical table.

Each of the above identified modules and programs correspond to a set of instructions for performing one or more functions described above. These modules (i.e., sets of instructions) need not be implemented as separate software programs, procedures or modules, and thus various subsets of these modules may be combined or otherwise re-arranged in various embodiments. In some embodiments, first memory 306 and second memory 308 may store a subset of the modules and data structures identified above. Furthermore, first memory 306 and second memory 308 may store additional modules and data structures not described above.

As shown in FIG. 3, in some embodiments, first memory 306 and second memory 308 are distinct and separate from each other (e.g., first memory 306 and second memory 308 are different types of memory devices, such as a ROM and a RAM). In some embodiments, first memory 306 and second memory 308 are parts of a same memory device.

Figure 4A:
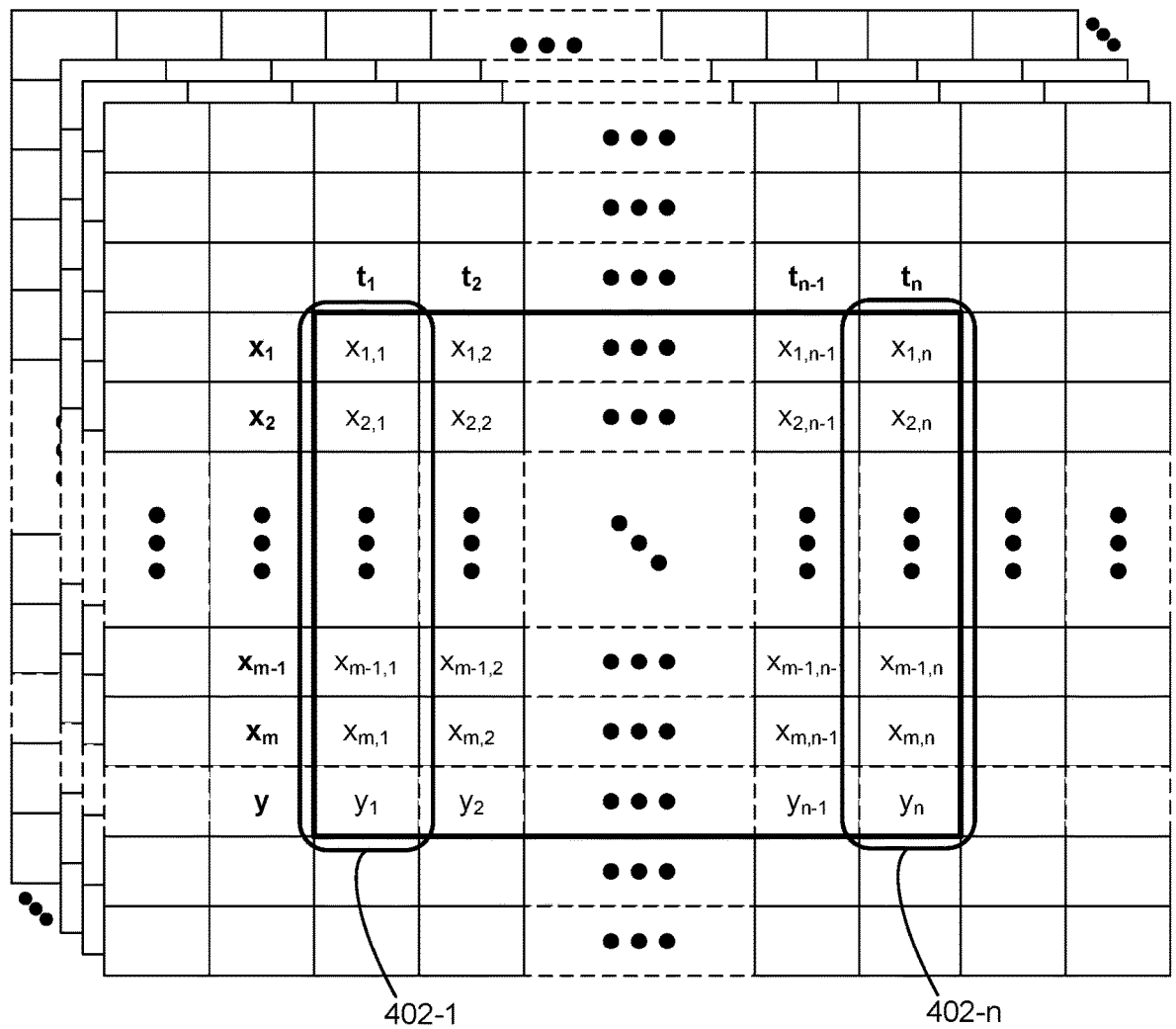
FIGS. 4A-4C are schematic diagrams illustrating in-memory operations on a logical table in accordance with some embodiments.
Figure 4B:
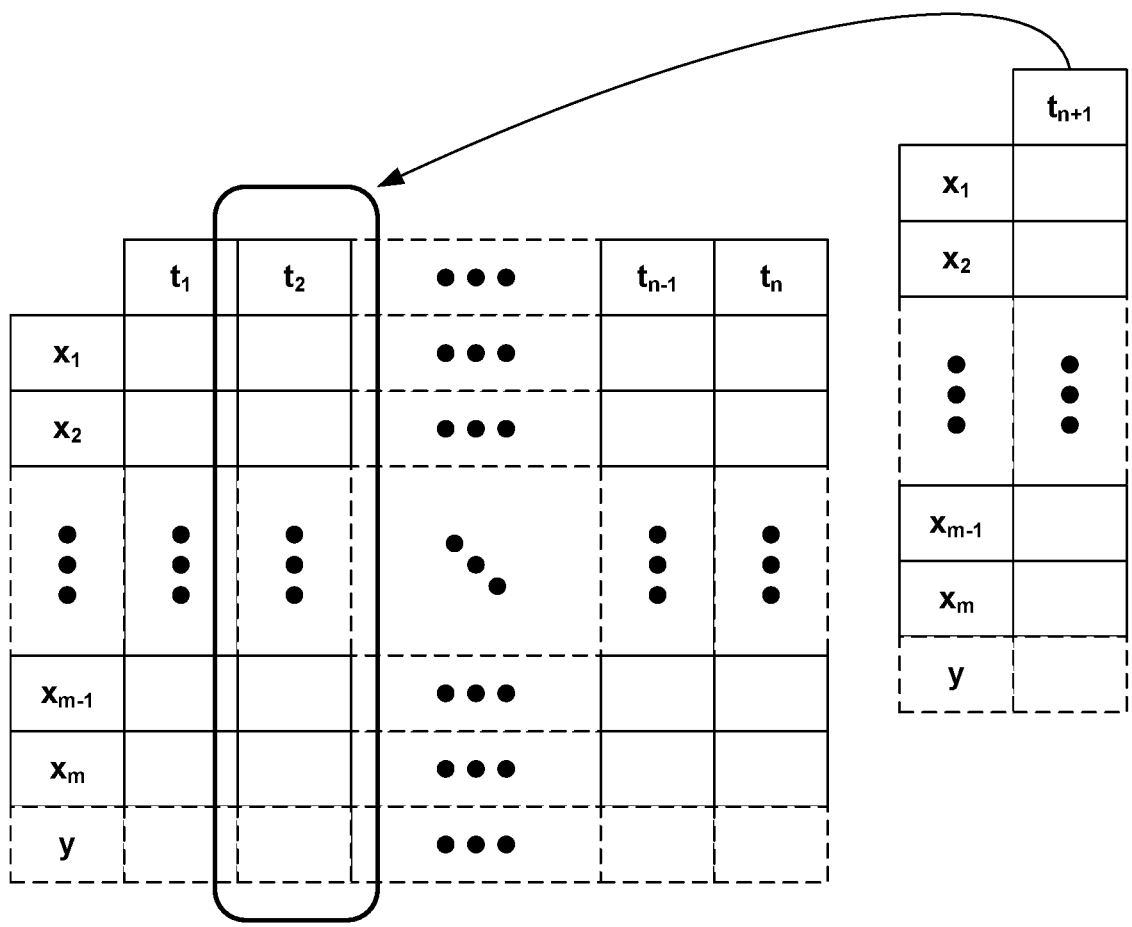
Figure 4C:
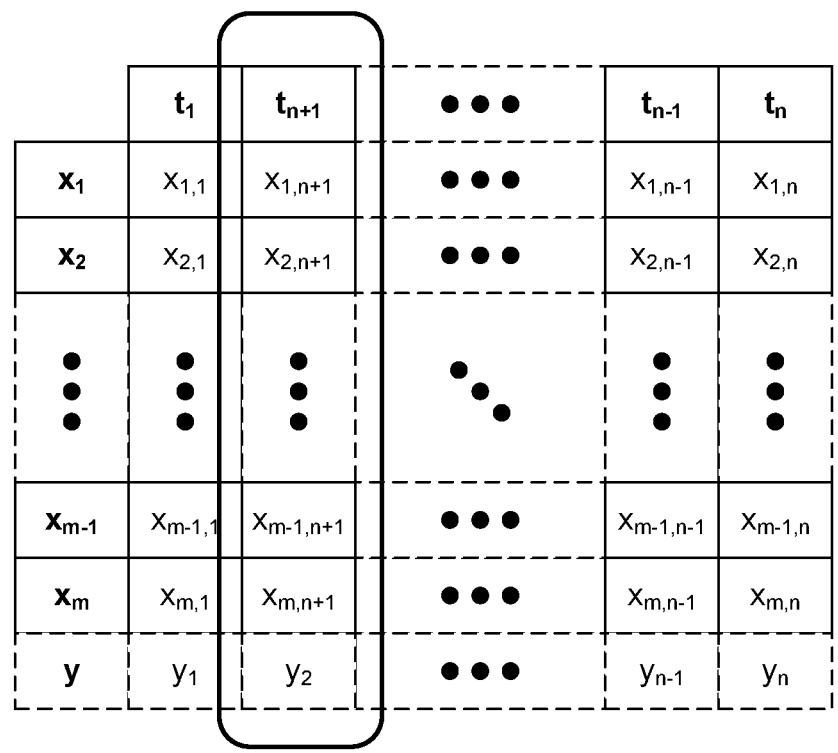

FIGS. 4A-4C are schematic diagrams illustrating in-memory operations on a logical table in accordance with some embodiments.

In FIG. 4A, memory (or pages of memory) includes a logical table with a plurality of input values, x. In some embodiments, the logical table consist of input values (and does not include an output value). In some embodiments, as shown in FIG. 4A, the logical table includes input values and one or more output values, y. The logical table shown in FIG. 4A has (m+1) rows and n columns (alternatively, the logical table has m rows and n columns when the logical table does not include output values y), and occupies a particular location (e.g., a range of memory addresses) on memory.

In FIG. 4A, each column of the logical table includes values that correspond to a particular time. For example, first column 402-1 of the logical table corresponds to a plurality of (input and output) values (for a plurality of parameters) that corresponds to a first time $t_1$ (e.g., values measured or received at the first time), and last column 402-$n$ of the logical table corresponds to a plurality of (input and output) values (for the same plurality of parameters) that corresponds to a second time $t_n$ that is distinct from the first time (e.g., values measured or received at the second time).

In some cases, the other areas of memory (locations not occupied by the logical table) are left blank. In some cases, the other areas of memory (locations not occupied by the logical table) are filled with (or used or reserved for) data other than the logical table.

In FIGS. 4B and 4C, the other areas of the memory are not shown so as not to obscure the features shown in FIGS. 4B and 4C.

FIG. 4B illustrates that the second column of the logical table is selected for replacement with values that correspond to a third time $t_{n+1}$ (e.g., the third time is subsequent to the first time and the second time).

FIG. 4C illustrates that the second column of the logical table is replaced with values that correspond to the third time $t_{n+1}$. In some embodiments, the second column of the logical table is overwritten with the values that correspond to the third time $t_{n+1}$.

In processing extremely large data sets (often called big data), increasing the size of the logical table to include the values that correspond to the third time can take a significant amount of computing power and time. In particular, allocating or reallocating the memory for changing the size of the logical table consumes a significant amount of resources and is inefficient. Instead of changing the size of the logical table, the in-memory replacement operations shown in FIGS. 4B and 4C allow direct replacement of values, which, in turn, allows fast and efficient preparation of the logical table for tracking operations.

In tracking operations with multiple parameters, a kernel function is frequently used.

FIGS. 5A-5C show examples of kernel matrices computed using the Gaussian kernel function in accordance with some embodiments.

FIG. 5A illustrates a formula for calculating a kernel matrix between the rows of matrix A and the rows of matrix B using the standard Gaussian kernel function, where:

$$A = \begin{bmatrix} a_{1,1} & \cdots & a_{1,n} \\ \vdots & \ddots & \vdots \\ a_{m,1} & \cdots & a_{m,n} \end{bmatrix}$$

$$B = \begin{bmatrix} b_{1,1} & \cdots & b_{1,n} \\ \vdots & \ddots & \vdots \\ b_{U,1} & \cdots & b_{U,n} \end{bmatrix}$$

and D is an adjustable kernel parameter.

FIG. 5B illustrates a formula for calculating a kernel matrix between the rows of matrix A and the columns of matrix C using the standard Gaussian kernel function.

When matrix C is a transpose of matrix B (and the same matrix A is used for both FIGS. 5A and 5B), the matrices resulting from the calculations shown in FIGS. 5A and 5B are equal.

$$C = \begin{bmatrix} c_{1,1} & \cdots & c_{1,V} \\ \vdots & \ddots & \vdots \\ c_{n,1} & \cdots & c_{n,V} \end{bmatrix}$$

FIG. 5C illustrates a formula for calculating a transposed kernel matrix between the columns of matrix C and the rows of matrix B using the standard Gaussian kernel function.

When matrix C is the transpose of matrix A (and the same matrix B is used for both FIGS. 5A and 5C), the matrix resulting from the calculation outlined in FIG. 5C is equal to the transpose of the matrix resulting from the calculation in FIG. 5A.

FIGS. 6A-6C show examples of kernel matrices computed using the inverse multiquadric kernel function in accordance with some embodiments. FIG. 6A illustrates a formula for calculating a kernel matrix between the rows of matrix A and the rows of matrix B using the inverse multiquadric kernel function. FIG. 6B illustrates a formula for calculating a kernel matrix between the rows of matrix A and the columns of matrix C using the inverse multiquadric kernel function. When matrix C is a transpose of matrix B (and the same matrix A is used for both FIGS. 6A and 6B), the matrices resulting from the calculations shown in FIGS. 6A and 6B are equal. FIG. 6C illustrates a formula for calculating a transposed kernel matrix between the columns of matrix C and the rows of matrix B using the inverse multiquadric kernel function. When matrix C is the transpose of matrix A (and the same matrix B is used for both FIGS. 6A and 6C), the matrix resulting from the calculation outlined in FIG. 6C is equal to the transpose of the matrix resulting from the calculation in FIG. 6A.

Although FIGS. 5A-5C and 6A-6C illustrate example kernel matrices using particular kernel functions, other kernel functions may be used. For example, triangular, parabolic, quartic, triweight, tricubic, cosine, logistic, sigmoid, and/or Silverman kernel functions may be used.

By using an updated logical table (where a column has been replaced with new values), the operations for obtaining (or calculating or generating) a kernel matrix (or a transposed kernel matrix) are accelerated compared to obtaining a kernel matrix from a logical table with an additional column of data.

Figure 7C:
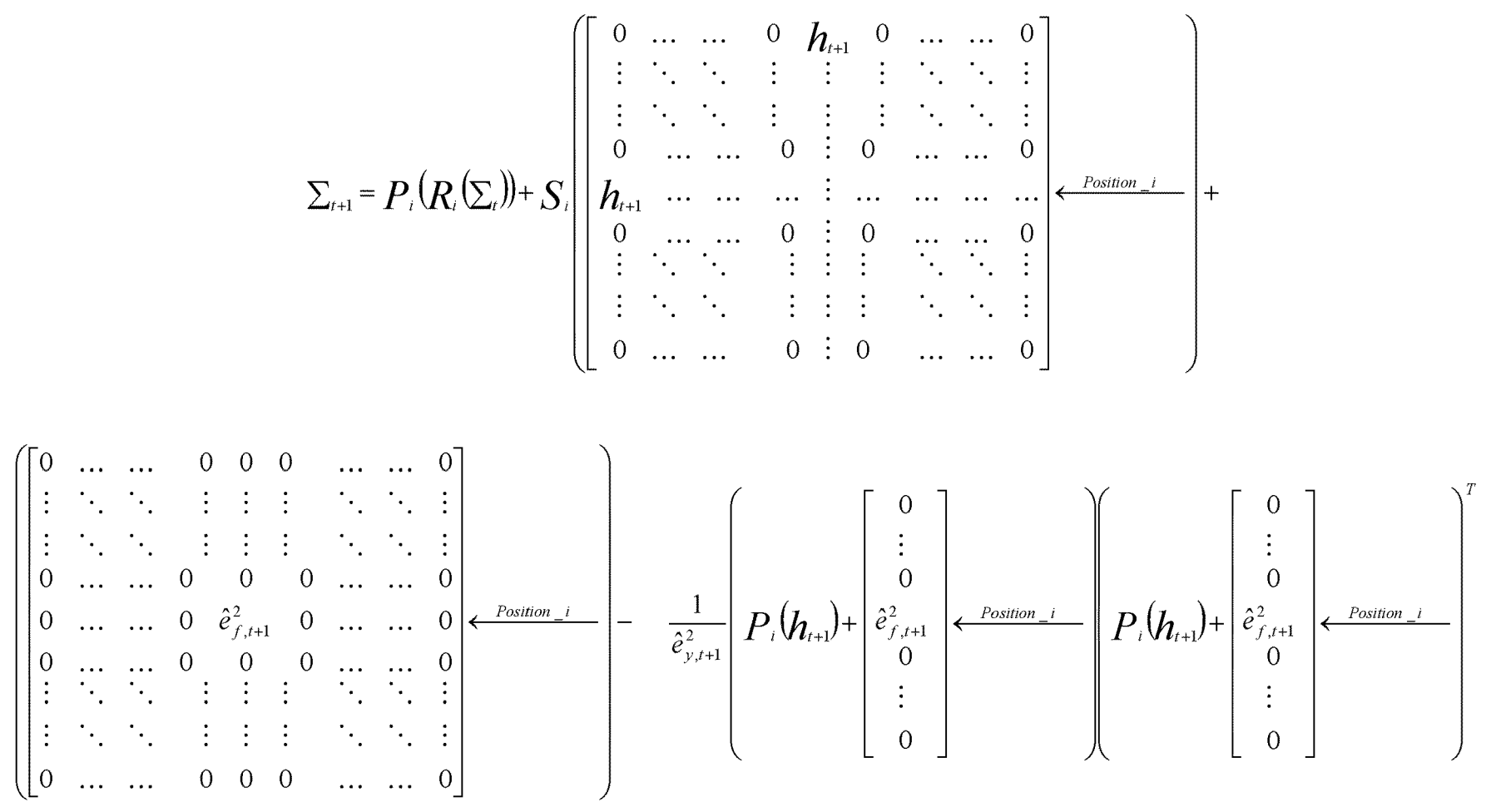

FIGS. 7A-7C show example numerical operations used for tracking in accordance with some embodiments.

In accordance with some embodiments, electronic tracker 300 has a predefined amount (or area) of memory for a logical table (e.g., see FIG. 4A).

Electronic tracker 300 receives an initial observation (e.g., receiving input values $x_1$, output value $y_1$). Electronic tracker 300 calculates an initial mean vector $\mu_1$, an initial covariance matrix $\Sigma_1$, and an inverse of an initial kernel matrix $Q_1$ as per equations shown in FIG. 7A. Electronic tracker 300 also writes the input values $x_1$ and output value $y_1$ as a column (e.g., a first column) of the logical table. The rest of the logical table is filled with 0 values.

Subsequently, electronic tracker 300 receives a new input $x_{t+1}$, and writes the new input $x_{t+1}$ into a column of the logical table.

In some embodiments, in accordance with a determination that the logical table includes at least one column filled with 0 values (or in accordance with a determination that the number of received inputs is less than a number of columns of the logical table), electronic tracker 300 writes the new input $x_{t+1}$ into the column filled with 0 values.

In some embodiments, in accordance with a determination that no column of the logical table remains filled with 0 values (or in accordance with a determination that the number of received inputs is greater than, or equal to, the number of columns of the logical table), electronic tracker 300 selects a column to be replaced (or overwritten) with the new input $x_{t+1}$.

Electronic tracker 300 computes $k^T_{t+1}$, the transposed kernel between $x_{t+1}$ and every basis in the logical table using the function $TK_{TN}(D_{t+1}, x_{t+1})$, such as the transpose Gaussian kernel matrix shown in FIG. 5C or the transpose inverse multiquadric kernel matrix shown in FIG. 6C). $D_{t+1}$ refers to the logical table at time t+1.

Electronic tracker 300 computes $q^T_{t+1} = k^T_{t+1} Q_t$.

Electronic tracker 300 computes predictive mean $\hat{y}_{t+1} = q^T_t + 1\mu_t$, and outputs the predicted output value for time t+1.

In some embodiments, electronic tracker 300 receives the actual output value $y_{t+1}$ (e.g., a measured output value). Electronic tracker 300 computes projection uncertainty $\gamma^2_{t+1} = k(x_{t+1}, x_{t+1}) - k^T_{t+1} q_{t+1}$. Electronic tracker 300 computes $h_{t+1} = \Sigma_t q_{t+1}$. Electronic tracker 300 computes noiseless prediction variance $\hat{e}^2_{f,t+1} = \gamma^2_{t+1} + q^T_{t+1} h_{t+1}$. Electronic tracker 300 computes predictive variance $\hat{e}^2_{y,t+1} = \hat{e}^2_{f,t+1} + \sigma^2_n$. Electronic tracker 300 computes the mean vector for time $t+1 \mu_{t+1}$, the covariance matrix for time $t+1 \Sigma_{t+1}$, and an inverse of a kernel matrix for time $t+1 Q_{t+1}$ using the equations shown in FIGS. 7B and 7C. In FIGS. 7B and 7C, $P_m$ symbolizes a projection which zeros out the m-th row (the m-th row is replaced with 0 entries), $R_m$ symbolizes a projection which zeros out the m-th column (the m-th column is filled with 0 entries), and $S_m$ symbolizes a projection which zeros out the entry in the m-th row and the m-th column (the m-th row and the m-th column are filled with 0 entries).

In some embodiments, electronic tracker 300 selects the basis for removal by computing the squared error for each candidate for basis removal, and selecting the basis for removal at the position i, where i is the position of the basis with the minimal squared error.

In some embodiments, electronic tracker 300 adjusts the mean vector, the covariance matrix, and/or the inverse of the kernel matrix by, for removing the basis at the position i, (i) obtaining a vector $qs_i$ including the i-th column of $Q_{t+1}$, where the i-th entry is overwritten by 0; preparing an adjusted $Q_{t+1}$ so that the adjusted $Q_{t+1}$ equals to $Q_{t+1}$ prior to the adjustment, with zeros inserted for the i-th row and the i-th column; and subtracting $(qs_i qs^T_i)/q_{ii}$ subtracted from each entry; (ii) preparing an adjusted $\mu_{t+1}$ so that the adjusted $\mu_{t+1}$ equals to $\mu_{t+1}$ prior to the adjustment, with the i-th entry replaced by 0; and (iii) preparing an adjusted $\Sigma_{t+1}$ so that the adjusted $\Sigma_{t+1}$ equals to $\Sigma_{t+1}$ prior to the adjustment, with zeros inserted for the i-th row and the i-th column.

Figure 8B:
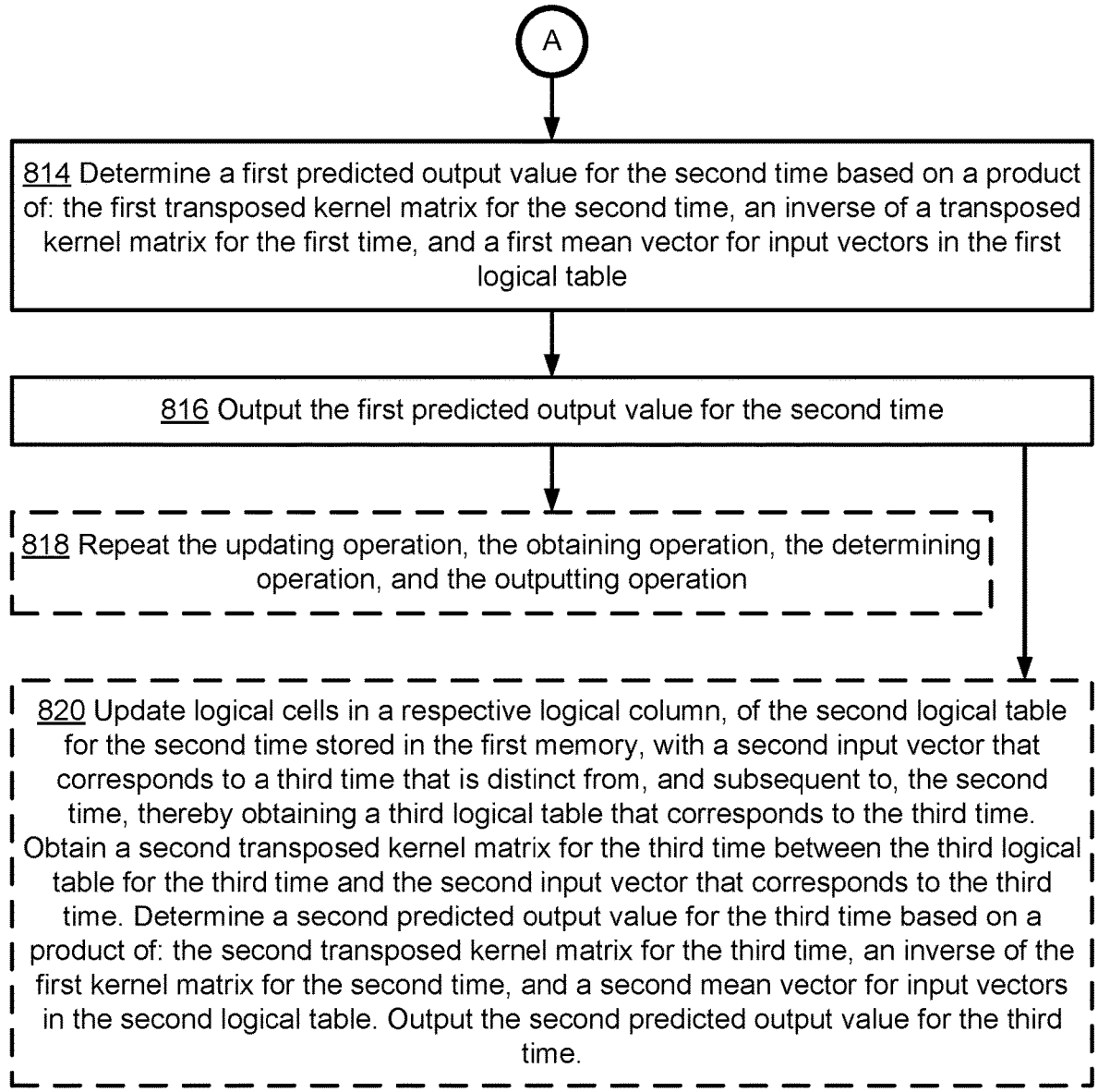

FIGS. 8A-8B are flow diagram illustrating method 800 of tracking signals in accordance with some embodiments.

Method 800 is performed by an electronic device (e.g., tracker 300). The electronic device includes one or more processors (e.g., one or more processors 302) and first memory (e.g., memory 306) storing a first logical table (e.g., logical table 310) that corresponds to a first time.

The first logical table for the first time includes a plurality of logical columns (e.g., columns 402-1 and 402-n), each logical column of the plurality of logical columns including an input vector of a plurality of input parameters corresponding to a respective time (e.g., $x_1, x_2, \ldots x_m$ for time $t_1$).

The first logical table for the first time also includes a plurality of logical rows (e.g., a first row of $x_1$ values, a second row of $x_2$ values, etc.) intersecting with the plurality of logical columns to define a plurality of logical cells, each logical row of the plurality of logical rows corresponding to, for the plurality of logical cells defined by the logical row, a respective input parameter of the plurality of input parameters.

The device updates (802) logical cells in a respective logical column, of the first logical table for the first time stored in the first memory, with a first input vector that corresponds to a second time that is distinct from, and subsequent to, respective times corresponding to the plurality of logical columns in the first logical table stored in the first memory, thereby obtaining a second logical table that corresponds to the second time (e.g., as shown in FIG. 4A-4C, an input vector for time $t_{n+1}$ is overwritten into the first logical table shown in FIG. 4A so that a resulting second logical table shown in FIG. 4C is obtained).

In some embodiments, the first logical table and the second logical table have the same size (e.g., the first logical table shown in FIG. 4A and the second logical table shown in FIG. 4C have the same number of cells, and in some cases, a same number of rows and the same number of columns).

In some embodiments, the first logical table occupies a first set of one or more locations in the first memory. The second logical table occupies a second set of one or more locations in the first memory. The first set of one or more locations in the first memory and the second set of one or more locations in the first memory are identical (e.g., the first logical table shown in FIG. 4A and the second logical table shown in FIG. 4C are located in the same memory location).

In some embodiments, the device selects (804) the respective logical column, of the first logical table for the first time, for at least partial replacement with the first input vector that corresponds to the second time (e.g., as shown in FIG. 4B, the device selects the second column for replacement with the input vector for time $t_{n+1}$).

In some embodiments, the device determines (806), for each logical column of two or more logical columns of the first logical table, an error associated with removal of the logical column and selecting a logical column, for at least partial replacement, based on errors associated with the two or more logical columns of the first logical table. For example, the device selects a column whose removal will cause the minimum error (e.g., the column having the least impact on the tracking operations). In some embodiments, the device selects a column with an associated error less than a predefined threshold.

The device obtains (808) a first transposed kernel matrix for the second time between the second logical table for the second time and the first input vector that corresponds to the second time. For example, the device computes $k^T_{t+1}$, the kernel between $x_{t+1}$ and every basis in the second logical table using the function $TK_{TN}(D_{t+1}, x_{t+1})$.

In some embodiments, obtaining the first transposed kernel matrix for the second time between the second logical table for the second time and the first input vector that corresponds to the second time includes (810): transposing the second logical table that corresponds to the second time (or a transpose thereof) to obtain a transposed updated logical table for the second time; obtaining a kernel matrix that corresponds to the second time between the transposed updated logical table that corresponds to the second time and the first input vector that corresponds to the second time; and transposing the kernel matrix that corresponds to the second time to obtain the first transposed kernel matrix.

In some embodiments, obtaining the first transposed kernel matrix for the second time between the second logical table for the second time and the first input vector that corresponds to the second time includes (812) processing the second logical table for the second time and the first input vector that corresponds to the second time with a transposed kernel operator (e.g., $TK_{TN}(D_{t+1}, x_{t+1})$). Compared to operations 810, the transposed kernel operator reduces the number of transpose operations required to obtain the first transposed kernel matrix, thereby improving the speed and efficiency of the device.

The device determines (814) a first predicted output value for the second time based on a product of: the first transposed kernel matrix for the second time, an inverse of a transposed kernel matrix for the first time, and a first mean vector for input vectors in the first logical table. For example, the device calculates a predictive mean $\hat{y}_{t+1} = q^T_{t+1} \mu_t$, where $q^T_{t+1} = k^T_{t+1} Q_t$.

The device outputs (816) the first predicted output value for the second time. For example, the device outputs the predictive mean $\hat{y}_{t+1}$.

In some embodiments, the device repeats (818) the updating operation, the obtaining operation, the determining operation, and the outputting operation.

In some embodiments, the device updates (820) logical cells in a respective logical column, of the second logical table for the second time stored in the first memory, with a second input vector that corresponds to a third time that is distinct from, and subsequent to, the second time, thereby obtaining a third logical table that corresponds to the third time (e.g., the third logical table is an updated version of the second logical table); obtains a second transposed kernel matrix for the third time between the third logical table for the third time and the second input vector that corresponds to the third time; determines a second predicted output value for the third time based on a product of: the second transposed kernel matrix for the third time, an inverse of the first kernel matrix for the second time, and a second mean vector for input vectors in the second logical table; and outputs the second predicted output value for the third time.

Figure 9:
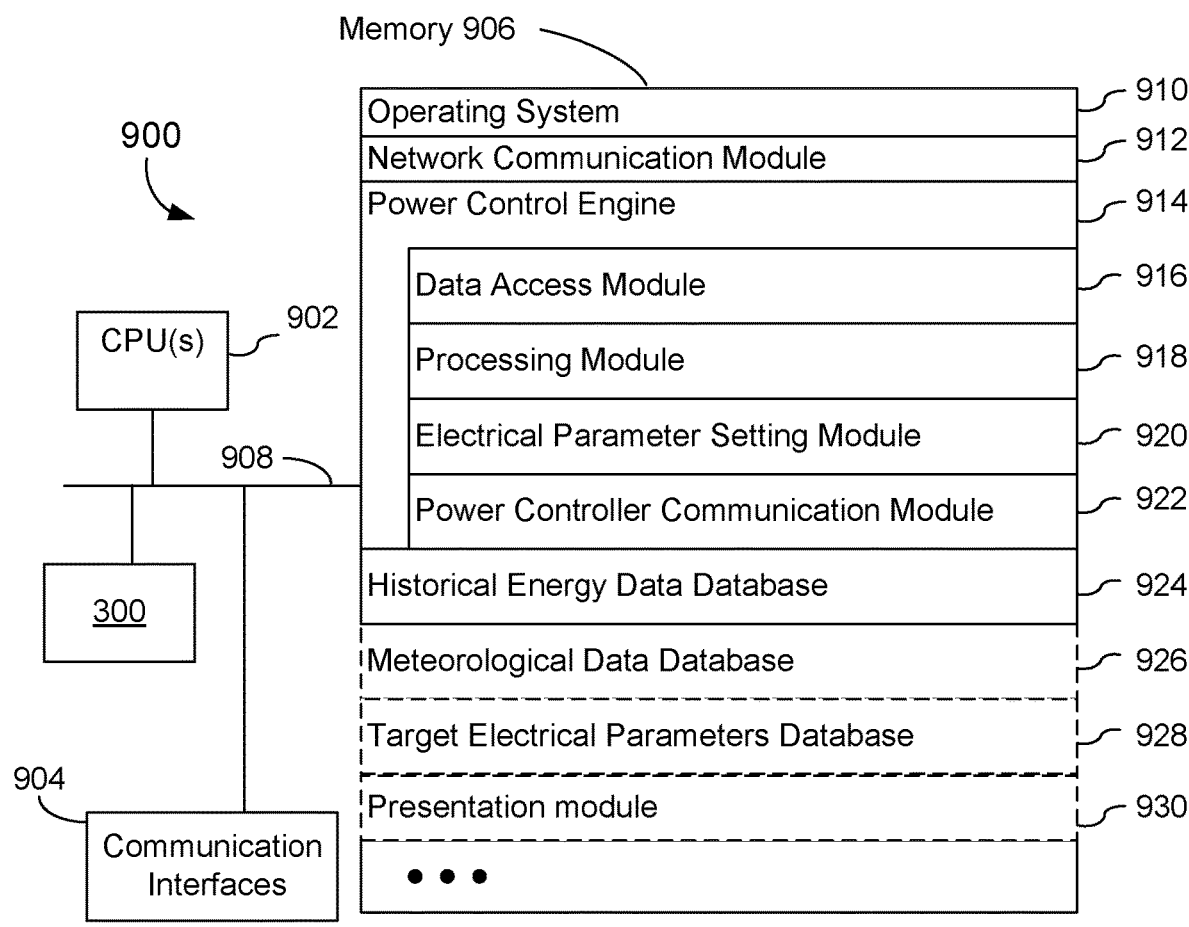
FIG. 9 is a block diagram illustrating an example electrical system in accordance with some embodiments.

FIG. 9 is a block diagram illustrating example electrical system 900 in accordance with some embodiments.

System 900 typically includes one or more processing units 902 (central processing units, application processing units, application-specific integrated circuit, etc., which are also called herein processors), one or more network or other communications interfaces 904, memory 906, and one or more communication buses 908 for interconnecting these components. In some embodiments, communication buses 908 include circuitry (sometimes called a chipset) that interconnects and controls communications between system components. In some embodiments, system 900 includes a user interface (e.g., a user interface having a display device, which can be used for displaying acquired images, one or more buttons, and/or other input devices).

In some embodiments, communications interfaces 904 include wired communications interfaces and/or wireless communications interfaces (e.g., Wi-Fi, Bluetooth, etc.).

System 900 also includes tracker 300, which is described herein with respect to FIG. 3. For brevity, the detailed description of tracker 300 is not repeated herein.

Memory 906 of system 900 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 906 may optionally include one or more storage devices remotely located from the processors 902. Memory 906, or alternately the non-volatile memory device(s) within memory 906, comprises a computer readable storage medium (which includes a non-transitory computer readable storage medium and/or a transitory computer readable storage medium). In some embodiments, memory 906 includes a removable storage device (e.g., Secure Digital memory card, Universal Serial Bus memory device, etc.). In some embodiments, memory 906 or the computer readable storage medium of memory 906 stores the following programs, modules and data structures, or a subset or superset thereof:

- operating system 910 that includes procedures for handling various basic system services and for performing hardware dependent tasks;
- network communication module (or instructions) 912 that is used for connecting system 900 to other computers (e.g., clients 302 and/or servers 304 shown in FIG. 3) via one or more communications interfaces 904 and one or more communications networks 306 (FIG. 3), such as the Internet, other wide area networks, local area networks, metropolitan area networks, and so on;
- power control engine 914 that determines electrical power parameters; and
- optionally, presentation module 946 that displays one or more information through a user interface.

In some embodiments, memory 906 also includes the following data structures, or a subset or superset thereof:

- historical energy data database 924 including historical energy data (e.g., historical real power consumption, historical reactive power consumption, historical operating voltages, historical operating currents, etc. for one or more electrical devices, such as industrial equipment, and/or associated statistical values, such as mean, median, standard deviation, minimum value, maximum value, percentile values, etc.);
- optionally, meteorological data database 926 including (current and/or historical) temperature information, humidity information, pressure information, and/or information representing cloud coverage; and
- optionally, target electrical parameter database 928 including target electrical power parameters for communication to a power controller.

In some embodiments, power control engine 914 includes the following programs, modules and data structures, or a subset or superset thereof:

- data access module 916 for accessing (e.g., reading) data from one or more databases and storing (e.g., writing) data to the one or more databases;
- processing module 918 for obtaining one or more target electrical power parameters;
- electrical parameter setting module 920 for setting electrical power parameters for one or more electrical devices; and
- power controller communication module 922 for communicating the one or more target electrical power parameter(s) to a power controller in communication with electrical system 900.

Each of the above identified modules and applications correspond to a set of instructions for performing one or more functions described above. These modules (i.e., sets of instructions) need not be implemented as separate software programs, procedures or modules, and thus various subsets of these modules may be combined or otherwise re-arranged in various embodiments. In some embodiments, memory 906 may store a subset of the modules and data structures identified above. Furthermore, memory 906 may store additional modules and data structures not described above.

Notwithstanding the discrete blocks in FIGS. 3 and 9, these figures are intended to be a functional description of some embodiments, although, in some embodiments, the discrete blocks in FIGS. 3 and 9 can be a structural description of functional elements in the embodiments. One of ordinary skill in the art will recognize that an actual implementation might have the functional elements grouped or split among various components. In practice, and as recognized by those of ordinary skill in the art, items shown separately could be combined and some items could be separated.

Figure 10:
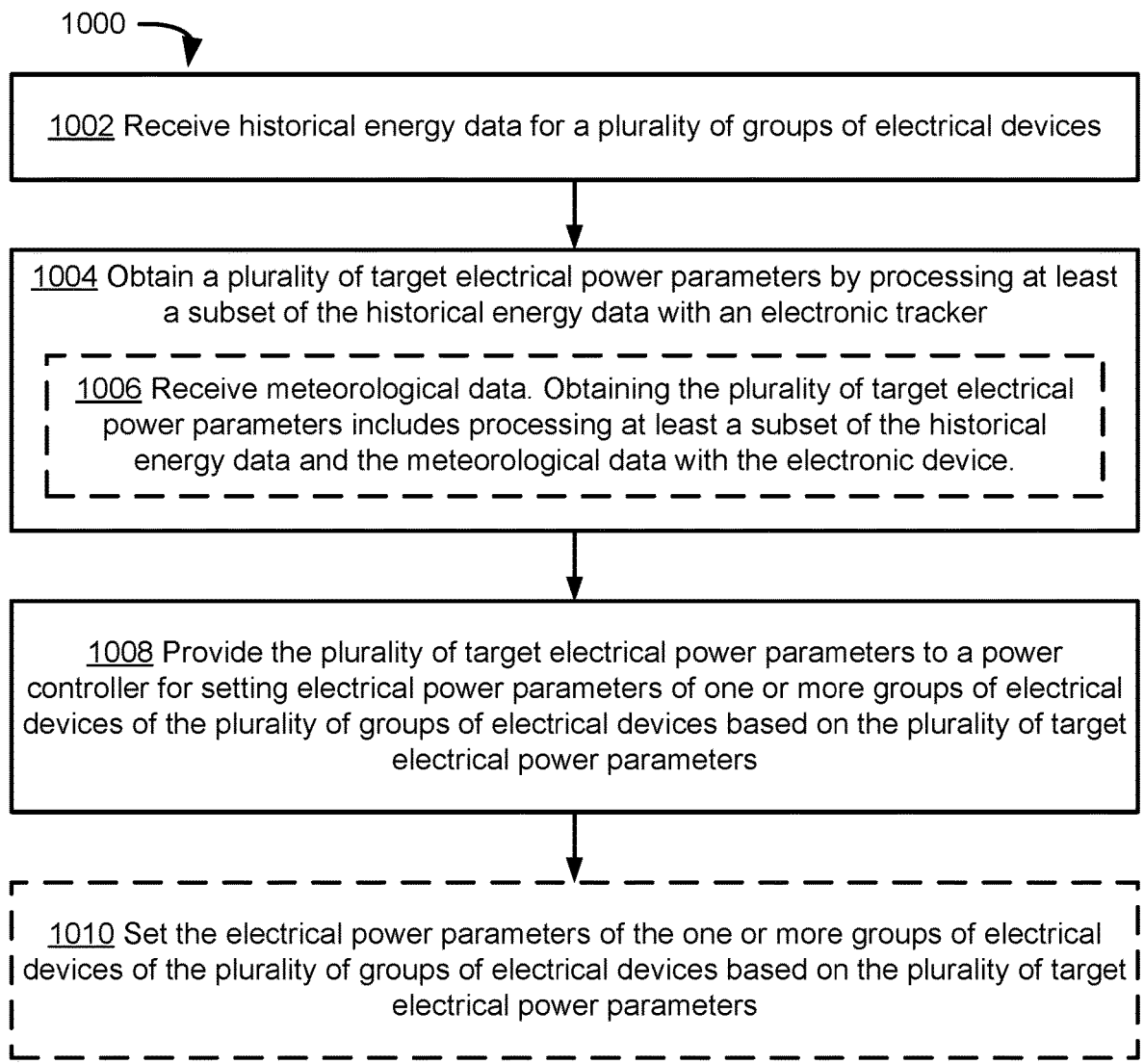
FIG. 10 is a flow diagram illustrating a method of determining electrical power parameters in accordance with some embodiments.

FIG. 10 is a flow diagram illustrating method 1000 of determining electrical power parameters in accordance with some embodiments.

Method 100 is performed by an electrical system (e.g., electrical system 900). In some embodiments, the electrical system includes an electronic tracker (e.g., electronic device 300).

The electrical system receives (1002) historical energy data for a plurality of groups of electrical devices.

In some embodiments, the historical energy data includes one or more data values selected from a group consisting of: a real power, a reactive power, a voltage, and a current for a respective electrical device. In some embodiments, the historical energy data includes one or more data values selected from a group consisting of: a real power, a reactive power, a voltage, and a current for a subset of the plurality of groups of electrical devices. In some embodiments, the historical energy data includes one or more data values selected from a group consisting of: a real power, a reactive power, a voltage, and a current for respective electrical devices of the plurality of groups of electrical devices. In some embodiments, the historical energy data includes one or more data values corresponding to statistical parameters for the group (e.g., power data), such as mean, median, standard deviation, minimum value, maximum value, percentile values, etc. for the real power, the reactive power, the voltage, and the current for respective electrical devices of the plurality of groups of electrical devices.

The electrical system obtains (1004) a plurality of target electrical power parameters by processing at least a subset of the historical energy data with the electronic tracker (e.g., electronic device 300). In some embodiments, the electrical system projects energy parameters (e.g., a real power, a reactive power, a voltage, and a current) for at least a subset of the plurality of groups of electrical devices, and calculates target electrical power parameters based on the projected parameters. For example, when a projected power consumption by a particular electrical device increases, the electrical system increases a target electrical power parameter (e.g., the delivered power) for the particular electrical device so that the particular electrical device can continue to operate without suffering from a low power delivered to it. In some cases, the electrical system reduces a target electrical power parameter (e.g., the delivered power) for another electrical device (e.g., an electrical device with a reduced projected power consumption) to enable the increased target electrical power parameter for the particular electrical device.

In some embodiments, the electrical system receives (1006) meteorological data. In some embodiments, the meteorological data includes one or more data values selected from a group consisting of: temperature information, humidity information, pressure information, and information representing cloud coverage. Obtaining the plurality of target electrical power parameters includes processing at least a subset of the historical energy data and the meteorological data with the electronic tracker (e.g., electronic device 300). For example, the electrical system increases the target electrical power parameter (e.g., real power) when the temperature information indicates that the ambient temperature has increased above a predefined range (e.g., a high temperature can lead to increased operations of air conditioners) or below the predefined range (e.g., a low temperature can lead to increase operations of heating elements).

The electrical system provides (1008) the plurality of target electrical power parameters to a power controller for setting electrical power parameters of one or more groups of electrical devices of the plurality of groups of electrical devices based on the plurality of target electrical power parameters.

In some embodiments, the electrical system sets (1010) the electrical power parameters of the one or more groups of electrical devices of the plurality of groups of electrical devices based on the plurality of target electrical power parameters.

The foregoing description, for purpose of explanation, has been described with reference to specific embodiments. However, the illustrative discussions above are not intended to be exhaustive or to limit the scope of claims to the precise forms disclosed. Many modifications and variations are possible in view of the above teachings. The embodiments were chosen and described in order to best explain the principles of the various described embodiments and their practical applications, to thereby enable others skilled in the art to best utilize the invention and the various described embodiments with various modifications as are suited to the particular use contemplated. For example, the methods of reducing accommodation described herein may be used in other refractive power measurement devices.

What is claimed is:

1. An electronic device, comprising:
   one or more processors;
   first memory storing a first logical table that corresponds to a first time, the first logical table for the first time including:
      a plurality of logical columns, each logical column of the plurality of logical columns including an input vector of a plurality of input parameters corresponding to a respective time; and
      a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters; and
   second memory storing one or more programs executable by the one or more processors, the one or more programs including instructions for:
      receiving historical energy data for a plurality of groups of electrical devices;
      generating, for at least a subset of the historical energy data, the first logical table that corresponds to the first time, wherein each input parameter of the plurality of input parameters corresponds to an electrical parameter of the historical energy data;
      updating logical cells in a respective logical column, of the first logical table for the first time stored in the first memory, with a first input vector that corresponds to a second time that is distinct from, and subsequent to, respective times corresponding to the plurality of logical columns in the first logical table stored in the first memory, thereby obtaining a second logical table that corresponds to the second time;
      obtaining a first transposed kernel matrix for the second time between (i) the second logical table for the second time and (ii) the first input vector that corresponds to the second time;
      determining a first predicted output value for the second time based on a product of: (i) the first transposed kernel matrix for the second time, (ii) an inverse of a transposed kernel matrix for the first time, and (iii) a first mean vector for input vectors in the first logical table; and
      providing the first predicted output value for the second time to a power controller for setting electrical power parameters of one or more groups of electrical devices of the plurality of groups of electrical devices based on the first predicted output value.

2. The electronic device of claim 1, wherein the first logical table and the second logical table have the same size.

3. The electronic device of claim 1, wherein:
   the first logical table occupies a first set of one or more locations in the first memory;
   the second logical table occupies a second set of one or more locations in the first memory; and
   the first set of one or more locations in the first memory and the second set of one or more locations in the first memory are identical.

4. The electronic device of claim 1, wherein the one or more programs include instructions for selecting the respective logical column, of the first logical table for the first time, for at least partial replacement with the first input vector that corresponds to the second time.

5. The electronic device of claim 1, wherein the one or more programs include instructions for determining, for each logical column of two or more logical columns of the first logical table, an error associated with removal of the logical column and selecting a logical column, for at least partial replacement, based on errors associated with the two or more logical columns of the first logical table.

6. The electronic device of claim 1, wherein obtaining the first transposed kernel matrix for the second time between (i) the second logical table for the second time and (ii) the first input vector that corresponds to the second time includes:
   transposing the second logical table for the second time to obtain a transposed updated logical table for the second time;
   obtaining a kernel matrix for the second time between (i) the transposed updated logical table for the second time and (ii) the first input vector that corresponds to the second time; and
   transposing the kernel matrix that corresponds to the second time to obtain the first transposed kernel matrix.

7. The electronic device of claim 1, wherein obtaining the first transposed kernel matrix for the second time between (i) the second logical table for the second time and (ii) the first input vector that corresponds to the second time includes processing the second logical table for the second time and the first input vector that corresponds to the second time with a transposed kernel operator.

8. The electronic device of claim 1, wherein the one or more programs include instructions for:
   updating logical cells in a respective logical column, of the second logical table for the second time stored in the first memory, with a second input vector that corresponds to a third time that is distinct from, and subsequent to, the second time, thereby obtaining a third logical table that corresponds to the third time;
   obtaining a second transposed kernel matrix for the third time between (i) the third logical table for the third time and (ii) the second input vector that corresponds to the third time;
   determining a second predicted output value for the third time based on a product of: (i) the second transposed kernel matrix for the third time, (ii) an inverse of the first kernel matrix for the second time, and (iii) a second mean vector for input vectors in the second logical table; and outputting the second predicted output value for the third time.

9. The electronic device of claim 1, wherein the one or more programs include instructions for repeating the updating operation, the obtaining operation, the determining operation, and the providing operation.

10. The electronic device of claim 1, wherein the one or more programs include instructions for setting the electrical power parameters of the one or more groups of electrical devices of the plurality of groups of electrical devices based on first predicted output value.

11. A non-transitory computer readable storage medium storing one or more programs for execution by one or more processors of an electrical system with the electronic device of claim 1, the one or more programs, which, when executed by the one or more processors, cause the electrical system to:
receive historical energy data for a plurality of groups of electrical devices;
obtain a plurality of target electrical power parameters by processing at least a subset of the historical energy data with the electronic device; and
provide the plurality of target electrical power parameters to a power controller communicatively coupled with the electrical system for setting electrical power parameters of one or more groups of electrical devices of the plurality of groups of electrical devices based on the plurality of target electrical power parameters.

12. A non-transitory computer readable storage medium storing one or more programs for execution by one or more processors of an electronic device, the one or more programs, which, when executed by the one or more processors of the electronic device, cause the electronic device to:
receive historical energy data for a plurality of groups of electrical devices;
generate, for at least a subset of the historical energy data, a first logical table that corresponds to a first time, the first logical table for the first time including: (i) a plurality of logical columns, each logical column of the plurality of logical columns including an input vector of a plurality of input parameters corresponding to a respective time and (ii) a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters, wherein each input parameter of the plurality of input parameters corresponds to an electrical parameter of the historical energy data;
store the first logical table in a first memory;
update logical cells in a respective logical column, of the first logical table for the first time stored in the first memory, with a first input vector that corresponds to a second time that is distinct from, and subsequent to, respective times corresponding to a plurality of logical columns in the first logical table stored in the first memory, thereby obtaining a second logical table that corresponds to the second time;
obtain a first transposed kernel matrix for the second time between (i) the second logical table for the second time and (ii) the first input vector that corresponds to the second time;
determine a first predicted output value for the second time based on a product of: (i) the first transposed kernel matrix for the second time, (ii) an inverse of a transposed kernel matrix for the first time, and (iii) a first mean vector for input vectors in the first logical table; and
provide the first predicted output value for the second time to a power controller for setting electrical power parameters of one or more groups of electrical devices of the plurality of groups of electrical devices based on the first predicted output value.

13. The non-transitory computer readable storage medium of claim 12, wherein the first logical table and the second logical table have the same size.

14. The non-transitory computer readable storage medium of claim 12, wherein:
the first logical table occupies a first set of one or more locations in the first memory;
the second logical table occupies a second set of one or more locations in the first memory; and
the first set of one or more locations in the first memory and the second set of one or more locations in the first memory are identical.

15. A method for processing time-dependent data, comprising:
at an electronic device that includes one or more processors and first memory storing a first logical table that corresponds to a first time, the first logical table for the first time including:
a plurality of logical columns, each logical column of the plurality of logical columns including an input vector of a plurality of input parameters corresponding to a respective time; and
a plurality of logical rows intersecting with the plurality of logical columns to define a plurality of logical cells, each logical row of the plurality of logical rows corresponding to, for the plurality of logical cells defined by the logical row, a respective input parameter of the plurality of input parameters:
receiving historical energy data for a plurality of groups of electrical devices;
generating, for at least a subset of the historical energy data, the first logical table that corresponds to the first time, wherein each input parameter of the plurality of input parameters corresponds to an electrical parameter of the historical energy data;
updating logical cells in a respective logical column, of the first logical table for the first time stored in the first memory, with a first input vector that corresponds to a second time that is distinct from, and subsequent to, respective times corresponding to the plurality of logical columns in the first logical table stored in the first memory, thereby obtaining a second logical table that corresponds to the second time;
obtaining a first transposed kernel matrix for the second time between (i) the second logical table for the second time and (ii) the first input vector that corresponds to the second time;
determining a first predicted output value for the second time based on a product of: (i) the first transposed kernel matrix for the second time, (ii) an inverse of a transposed kernel matrix for the first time, and (iii) a first mean vector for input vectors in the first logical table; and
providing the first predicted output value for the second time to a power controller for setting electrical power parameters of one or more groups of electrical devices of the plurality of groups of electrical devices based on the first predicted output value.

16. The method of claim 15, further comprising:
receiving meteorological data; and
determining the first predicted output value for the second time further based on processing at least a subset of the historical energy data and the meteorological data with the electronic device.

17. The method of claim 16, wherein the meteorological data includes one or more data values selected from a group consisting of:
temperature information, humidity information, pressure information, and information representing cloud coverage.

18. The method of claim 15, wherein the historical energy data includes one or more data values selected from a group consisting of: a real power, a reactive power, a voltage, and a current for a respective electrical device.

* * * * *